US009390207B2

(12) United States Patent
Killough

(10) Patent No.: US 9,390,207 B2
(45) Date of Patent: Jul. 12, 2016

(54) SYSTEM AND METHOD OF HYDROCARBON FORMATION MODELING

(75) Inventor: John Killough, Austin, TX (US)

(73) Assignee: LANDMARK GRAPHICS CORPORATION, Houston, TX (US)

(*) Notice: Subject to any disclaimer, the term of this patent is extended or adjusted under 35 U.S.C. 154(b) by 448 days.

(21) Appl. No.: 13/391,927

(22) PCT Filed: Sep. 2, 2009

(86) PCT No.: PCT/US2009/055646
§ 371 (c)(1),
(2), (4) Date: Feb. 23, 2012

(87) PCT Pub. No.: WO2011/028197
PCT Pub. Date: Mar. 10, 2011

(65) Prior Publication Data
US 2012/0179439 A1    Jul. 12, 2012

(51) Int. Cl.
| | |
|---|---|
| *G06G 7/50* | (2006.01) |
| *G06F 17/50* | (2006.01) |
| *E21B 49/00* | (2006.01) |
| *G01V 11/00* | (2006.01) |
| *E21B 43/00* | (2006.01) |

(52) U.S. Cl.
CPC ............ *G06F 17/5018* (2013.01); *E21B 43/00* (2013.01); *E21B 49/00* (2013.01); *G01V 11/00* (2013.01); *G01V 2210/663* (2013.01)

(58) Field of Classification Search
USPC .................................................. 703/2, 9, 10
See application file for complete search history.

(56) References Cited

U.S. PATENT DOCUMENTS

| | | |
|---|---|---|
| 7,027,354 B2 | 4/2006 | Cole et al. |
| 2005/0073910 A1 | 4/2005 | Cole et al. |
| 2008/0208539 A1 | 8/2008 | Lee et al. |

FOREIGN PATENT DOCUMENTS

| | | |
|---|---|---|
| CN | 101366041 A | 2/2009 |
| WO | 2007149766 A2 | 12/2007 |

OTHER PUBLICATIONS

Osako, Ichiro et al. Timestep Selection During Streamline Simulation Through Transverse Flux Correction. SPE Journal (SPE 79688). Dec. 2004.*
Blunt, Martin J. et al. Prediction of Gas Injection Performance for Heterogeneous Reservoirs; Quarterly Technical Report; Reporting Period: Start Date Jan. 1, 1998, End Date Mar. 31, 1998. National Petroleum Technology Office. Tulsa, Oklahoma. Apr. 30, 1998.*
G.Enchery, M.Le Ravalec-Dupin, and F. Roggero, An Improved Pressure and Saturation Downscaling Process for a Better Integration of 4D Seismic Data Together with Production History, Jun. 11-14, 2007, 7 pp., SPE 107088, SPE Europec/EAGE Annual Conference and Exhibition, London, United Kingdom.*

(Continued)

*Primary Examiner* — Saif Alhija

(57) ABSTRACT

Hydrocarbon formation modeling. At least some of the illustrative embodiments are methods including simulating reaction of the formation to hydrocarbon extraction over a plurality of time steps. With each time step, the illustrative method makes a first approximation of migration of saturations for at least one grid block of the plurality of grid blocks (wherein migration of the saturation within at least one time step spans more than one grid block), and then correct the first approximation of migration of saturations for an effect not considered in the first approximation.

19 Claims, 2 Drawing Sheets

(56) References Cited

OTHER PUBLICATIONS

International Search Report and Written Opinion issued Jun. 3, 2010 in International Patent Application Serial No. PCT/US2009/055646.
Osako, Ichiro. Timestep Selection During Streamline Simulation Via Transverse Flux Correction. Master of Science Thesis. Texas A&M University. Dec. 2003.
Blunt, Martin J. et al. Prediction of Gas Injection Performance for Heterogeneous Reservoirs. National Petroleum Technology Office. Tulsa, OK. Dec. 1999.
Yuhu Bai et al., Title Unknown, Science in China Ser. E: Engineering & Materials Science, vol. 35 No. 7, Jul. 20, 2005, pp. 761-772. (Translation unavailable).
G.Enchery, M.Le Ravalec-Dupin, and F. Roggero, An Improved Pressure and Saturation Downscaling Process for a Better Integration of 4D Seismic Data Together with Production History, Jun. 11-14, 2007, 7 pages, SPE 107088, SPE Europec/EAGE Annual Conference and Exhibition, London, United Kingdom.

* cited by examiner

SYSTEM AND METHOD OF HYDROCARBON FORMATION MODELING

BACKGROUND

In order to maximize hydrocarbon production from hydrocarbon reservoirs, oil and gas companies simulate reservoir extraction techniques using reservoir models, and then implement actual extraction based on the outcomes identified. The complexity and accuracy of the reservoir modeling has increased both as computer technology has advanced, and as reservoir modeling techniques have improved.

In the reservoir modeling realm, there are tradeoffs between reservoir model accuracy and speed of running simulations using the reservoir model. More accurate reservoir models are more complex and take longer to produce results. Less complex reservoir models may produce results more quickly or with less computational cost, but may not adequately take into account geophysical actions and reactions. Thus, any technique which more accurately and more quickly performs reservoir modeling is highly sought after.

BRIEF DESCRIPTION OF THE DRAWINGS

For a detailed description of exemplary embodiments, reference will now be made to the accompanying drawings in which.

NOTATION AND NOMENCLATURE

Figure 1:
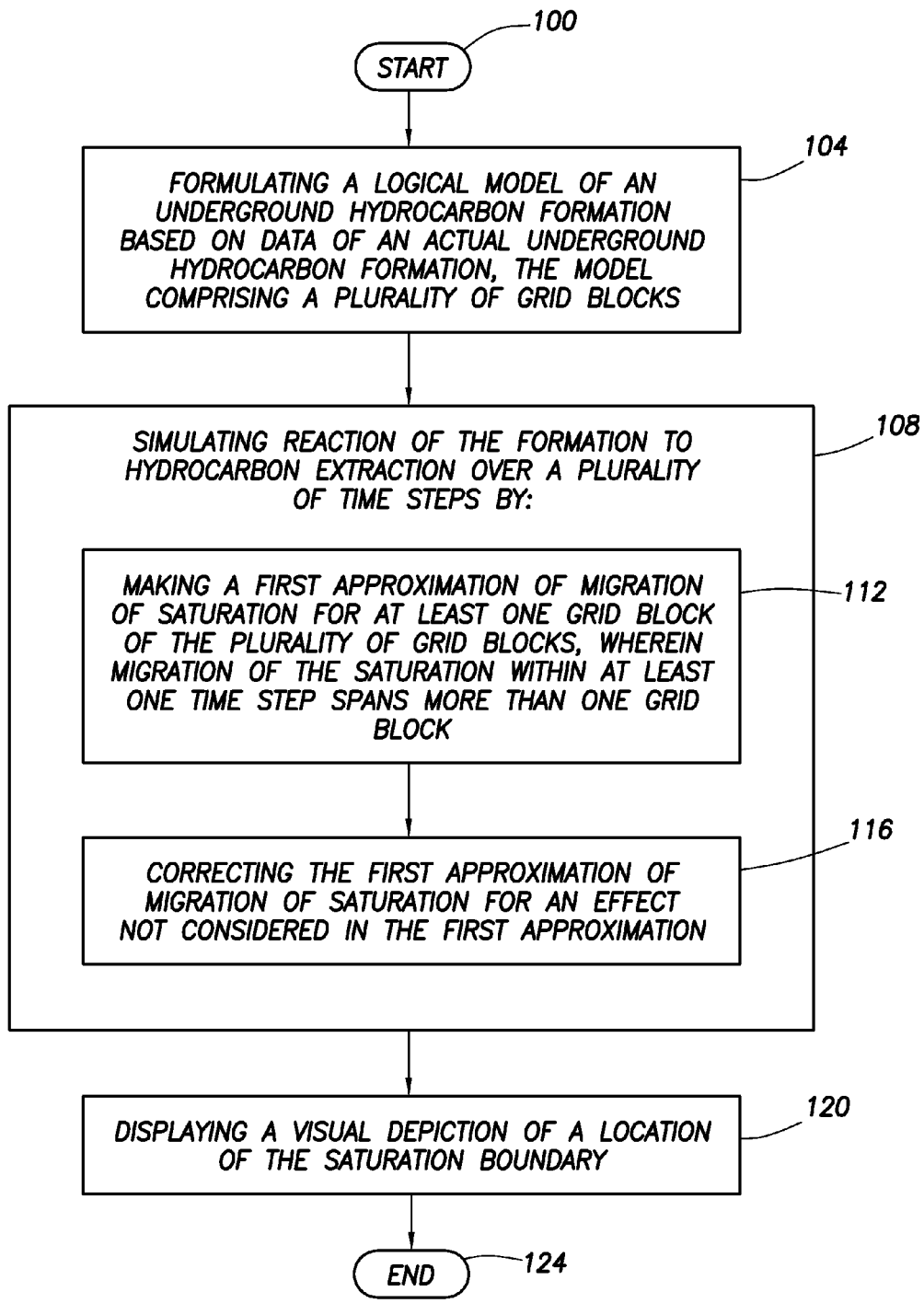
FIG. 1 shows a method in accordance with at least some embodiments.

Certain terms are used throughout the following description and claims to refer to particular system components. As one skilled in the art will appreciate, oil and gas companies may refer to a component by different names. This document does not intend to distinguish between components that differ in name but not function.

In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections.

"Saturations" shall mean relative proportion of components modeled. Thus, saturations may be saturations of water and hydrocarbon within the modeled volume, or saturations of different hydrocarbons within the modeled volume.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Related art techniques for modeling hydrocarbon formations have inherent limitations. For example, one technique for reservoir modeling is known as the finite difference technique. The finite differences technique models the reservoir as a plurality of grid blocks of particular size. Differential equations that predict the pressure of hydrocarbons and/or water within each grid block are solved. Based on the pressures calculated, fluid flow velocity at each face of each grid block is calculated. However, the finite difference technique is limited in the sense that the model cannot easily account for a flow of hydrocarbon and/or water that traverses more than one grid block within a modeled period (i.e., time step). Depending on grid block size and speed of fluid movement, the time step for the finite difference technique may be limited to an extremely small size (e.g., a day or less). When modeling reservoir extraction over the life of a reservoir, which may be on the order of 20 years or more, time steps on the order of one day or less may be excessively small.

Another reservoir modeling technique, that does not have the small time step limitation, is the streamline technique (also known as the Euler-Lagrangian technique). The streamline technique initially uses a finite difference-type technique to determine pressures and fluid flow (i.e., velocities) at the grid block boundaries (the Euler portion), but then uses the velocities to three-dimensionally interpolate fluid flow across many grid blocks (the Lagrangian portion). For example, the interpolated fluid flows may stream many grid blocks during the modeled period, hence the term "streamlines". The time step for the streamline technique can span significantly longer time periods (e.g., 60, 90, 180 days), and thus can more quickly model reservoir reaction to particular extraction techniques. However, in order to use the streamline technique some of the physics of fluid flow are ignored. For example, the streamline technique does not readily account for: gravity; changes in relative permeability as water saturation changes; how capillary pressure affects fluid flow in the porous media; or fluid flow transverse to the streamline flow (transverse flux).

One technique to take into account at least some of the physics of fluid flow in conjunction with the streamline technique is known as "operator splitting." Operator splitting can be conceptualized as a two step process; first the traditional streamline technique is applied and the fluid "moved" along the streamline in the model; and then the physics of fluid flow (such as gravity) are applied to the stationary fluid at the new location. In this regard, operator splitting is referred to as an "explicit" technique, meaning that the solutions to the equations regarding the physics of fluid flow are solved sequentially, rather than simultaneously, with the equations regarding streamline technique. While operator splitting to consider physics of fluid flow otherwise ignored by the streamline technique improves model accuracy, the accuracy increase is limited.

In a Society of Petroleum Engineers paper titled "Timestep Selection During Streamline Through Transverse Flux Correction", the authors Osako, Datta-Gupta and King describe performing the streamline technique that implicitly considers transverse flux. However, in adding consideration of the transverse flux the Osako et al. technique becomes limited in time step size. For the Osako et al. system to remain numerically stable the time step must be selected such that "[t]he fastest wave must not pass across an entire cell during a timestep." Thus, though Osako et al. discusses an "improved" streamline technique, one major benefit of streamline technique—the ability to use large time steps—is lost.

The various embodiments are directed to systems and methods, along with computer-readable storage media storing instructions, that perform reservoir modeling with the benefits of both implicitly taking into account physical phenomenon such as relative permeability and capillary pressure, and also the ability to use large time steps. The description will first give an overview in words, followed by a more mathematical treatment.

The various embodiments are directed to logically dividing the formation into a plurality of volumes, or grid blocks. In particular embodiments, the number of grid blocks may be on the order of millions of grid blocks, but greater or fewer such grid blocks may be equivalently used. In some embodiments, the grid blocks are of equal volume, but in other embodiments the grid blocks may be of varying volume based on the activity of movement of hydrocarbons and/or water within the grid block. For example, smaller grid blocks may be used in "active" areas, whereas larger grid blocks may be used in areas with little or no movement of fluids.

For each grid block, and taking into account inherent formation pressures as well as pressure associated with sources (e.g., injection wells) and sinks (e.g., production wells), the pressure of the fluids at each grid block boundary is calculated. In particular embodiments, the pressure is calculated using the finite differences technique (i.e., Eulerian technique). Based on the pressures at each grid block boundary, or more precisely differences in pressures considered across the grid block boundaries, flow velocities are determined.

Based on the flow velocities, the progression of the fluid saturations (or mass) is determined over the time step. Stated otherwise, the saturations (or masses) in each grid block at the end of the time step are determined. In particular embodiments, determining the progression of the saturations uses the Lagrangian technique, and thus the modeled fluids may "flow" across multiple grid blocks. However, as discussed above, the Lagrangian technique of this step of the process does not account for many physical properties of flow which effect accuracy of the calculated water saturation in each grid block. For example, the water saturation calculated does not take into account: gravity; changes in relative permeability as water saturation changes; how capillary pressure affects fluid flow in the porous media; or fluid flow transverse to the streamline flow (transverse flux).

In accordance with the various embodiments, performing the initial steps similar to the streamline technique represents a rough estimate or first approximation of the migration of the saturation (e.g., water saturation) in the modeled formation, and the first approximation is then modified or corrected to take into account some or all of the physical effects noted above. However, correcting for such physical effects should not adversely affect the length of the time step, as appears to be the case in the technique of the Osaka et al. paper noted above. In particular, with the results of the first approximation, the various embodiments calculate a value being the change in saturation within each grid block multiplied by the cell pore volume divided by the time step size. The value is an indication of the flow of fluid which has occurred during a time period. Next, and again within each grid block, a total velocity of the fluids is determined. And finally, the method turns to solving simultaneous Buckley-Leverett equations modified to include at least one, but in particular embodiments a plurality, of considerations such as relative permeability as between the hydrocarbons and water in the grid block, capillary pressure, gravity, or transverse flux. Calculation of the fluid flow, fluid velocity and solving of the Buckley-Leverett may be performed multiple times until the value is reduced (and in some case minimized), but in some cases a single iteration is sufficient.

When solved, the equations provide corrections to the water saturation determination. Unlike Osaka et al., the various embodiments do not result in numerical instability. Stated otherwise, the corrections do not impose time step limitations because the corrections can "move" the saturations across grid block boundaries.

Turning now to a more mathematical treatment of the correction in accordance with the various embodiments. With the water saturations of the first approximation complete, the method turns to calculating, for each grid block, a residual value of the flow of fluid (e.g., water) using substantially the following equation:

$$Rw(i, j, k) = -\Delta Sw^{n+1}(i, j, k) \frac{P v^{n+1}(i, j, k)}{\Delta t B w^{n+1}} \quad (1)$$

where $R_w(i,j,k)$ is the residual value for a particular grid block, $S_w(i,j,k)^{n+1}$ is the saturation calculated for the particular grid block, $P_v(i,j,k)$ is the pore volume within the grid block, $\Delta t$ is the time step size, and $B_w$ is the fluid formation volume factor, and n is the time step.

Next, the total velocity of fluids at the interfaces of each grid block are determined using substantially the following equation:

$$u_t = \sum_{i=o,w,g} T_i \Delta \Phi_i \quad (2)$$

where $u_t$ is the total velocity, $T_i$ is the transmissibility times of the upstream mobility of phase i, $\Delta\phi$ is the potential gradient at the interface of each grid block, and where the phase i is oil (o), water (w) and/or gas (g).

Finally, the Buckley-Leverett equations for each cell are solved using the total velocity number calculated from equation (2), with solutions iteratively determined until the error or residual values meet a predetermined value, such as a minimum. The Buckley-Leverett equation takes substantially the following form:

$$\frac{\partial S_w}{\partial t} + u_t^{n+1} \cdot \nabla f_w^{n+1} = 0 \quad (3)$$

where $S_w$ is saturation (e.g., water saturation), $u_t$ is the total fluid velocity, $f_w$ is the fractional fluid flow, t is time, and n is the time step. Again, equation (3) serves as an example but does not limit the technique to the solution of only water saturations. Other saturations and/or compositions could also be solved.

In accordance with the various embodiments, the additional physical effects to be considered are included in the equations for fractional fluid flow $f_w$ and/or fluid velocity term $u_t$. For example, in a two phase system (i.e., oil and water) where the correction applied is to address relative permeability between water and oil within the grid block, and considering only a single dimension, the $f_w$ could take the following form:

$$f_w^{n+1} = \frac{\frac{K_{rw}^{n+1}}{\mu_w^{n+1}}}{\frac{K_{ro}^{n+1}}{\mu_o} + \frac{K_{rw}^{n+1}}{\mu_w}} \quad (4)$$

where $K_{rw}$ is relative permeability of the water (given by the equation below), $K_{ro}$ is relative permeability of the oil (given by the equation below), $\mu_w$ is viscosity of the water, and $\mu_o$ is viscosity of the oil. However, the relative permeabilities are not constants in Equation (4). The equation regarding the relative permeability of water $K_{rw}$ and relative permeability of oil $K_{ro}$ may take the form:

$$K_{rw}^{n+1} = K_{rw}^n + \frac{\partial K_{rw}^n}{\partial S_w}(\Delta S_w^{n+1}) \quad (5)$$

$$K_{ro}^{n+1} = K_{ro}^n + \frac{\partial K_{ro}^n}{\partial S_w}(\Delta S_w^{n+1}) \quad (6)$$

with the various parameters defined as above.

So as not to unduly complicate the description, the particular expansion of the fractional fluid flow in equations (4), (5) and (6) takes into account relative permeability, a single dimension and only two phases; however, one of ordinary skill, now understanding the methodology, could easily expand the considerations to multiple dimensions and multi-phases/multi-components, as well as to take into account other effects, such as: gravity; capillary pressure; and transverse flux.

Using Von Neumann analysis, solution of the implicit equations above for saturations and/or compositions leads to an unconditionally stable method with no limitation on timestep.

FIG. 1 shows a method in accordance with at least some embodiments. In particular, the method starts (block 100) and proceeds to formulating a logical model of an underground hydrocarbon formation based on data of an actual underground hydrocarbon formation, the model comprising a plurality of grid blocks (block 104). Next, the illustrative method simulates reaction of the formation to hydrocarbon extraction over a plurality of time steps (block 108) by: making a first approximation of migration of saturation (e.g., water saturation) for at least one grid block of the plurality of grid blocks, wherein migration of the saturation within at least one time step spans more than one grid block (block 112); and then correcting the first approximation of migration of saturation for an effect not considered in the first approximation (block 116). Finally, the illustrative method displays a visual depiction of a location of the water saturation boundary (block 120), and the method ends (block 124).

Many variations of the techniques described above are possible. For example, in particular embodiments grid block sizes may be reduced in active areas to reduce computational times. As yet another example, in areas where there is little or no fluid movement as identified in the first approximation, the grid block sizes could be enlarged in those areas, and/or the system may refrain from solving the Buckley-Leverett equations in the areas identified as having little or no fluid movement. Further still, in areas where there is little no fluid movement, a mere two-component system could be assumed (i.e., oil and gas), and where significant fluid movement is expected, the model complexity could be increased to account for multiple components (e.g., methane, hexane, butane, etc.). Further still, for particular fluid types and at particular porosities of the sandstone, there will be little or no movement of the fluids. In the alternative embodiments the techniques described above could be used to initially model all areas, and then perform no further modeling in areas where no movement is likely because of the fluid viscosity and porosity relationship (rather than an arbitrary cut off porosity of the related art).

Figure 2:
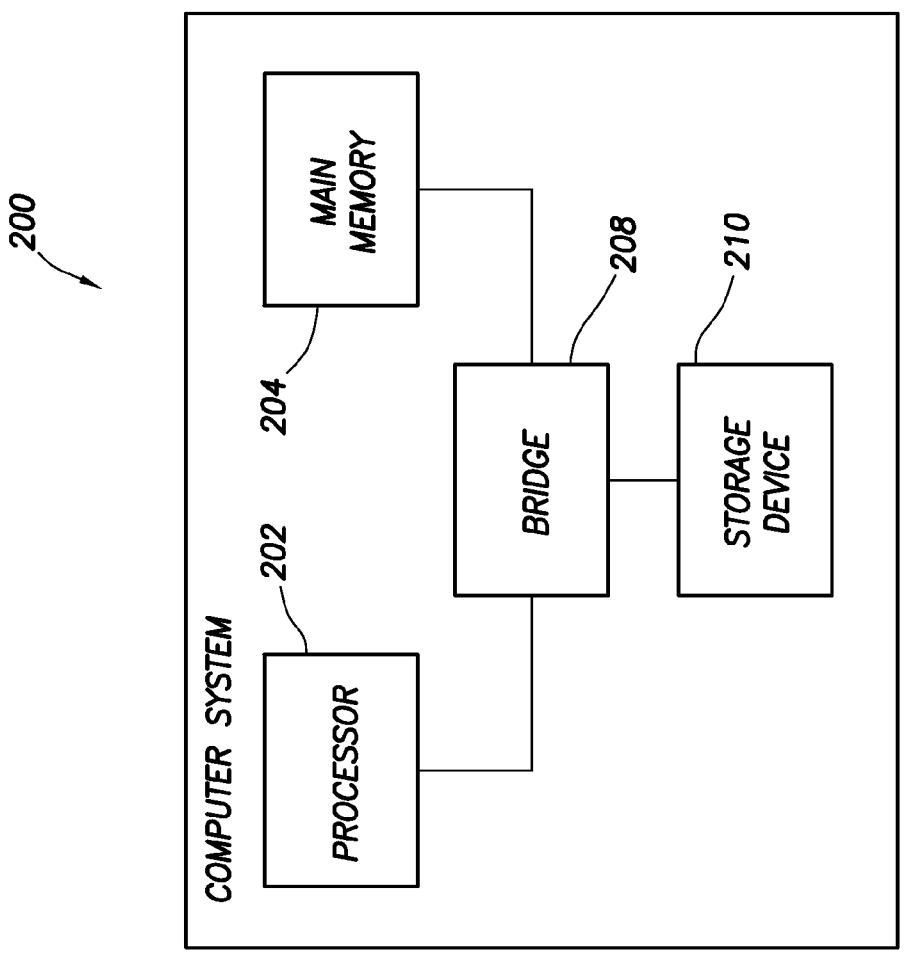
FIG. 2 shows a computer system in accordance with at least some embodiments.

FIG. 2 illustrates in greater detail a computer system 200, which is illustrative a computer system upon which the various embodiments may be practiced. The computer system 200 comprises a processor 202, and the processor couples to a main memory 204 by way of a bridge device 208. Moreover, the processor 202 may couple to a long term storage device 210 (e.g., a hard drive, "floppy" disk, memory stick) by way of the bridge device 208. Programs executable by the processor 202 may be stored on the storage device 710, and accessed when needed by the processor 202. The program stored on the storage device 210 may comprise programs to implement the various embodiments of the present specification, including programs to implement modeling formation response to extraction techniques. In some cases, the programs are copied from the storage device 210 to the main memory 204, and the programs are executed from the main memory 204. Thus, both the main memory 204 and storage device 210 are considered computer-readable storage mediums. The results of the modeling by the computer system 200 may be sent to a display device which may make a representation for viewing by a reservoir engineer or other person skilled in the art.

From the description provided herein, those skilled in the art are readily able to combine software created as described with appropriate computer hardware (including parallel computing systems) to create a special purpose computer system and/or special purpose computer sub-components in accordance with the various embodiments, to create a special purpose computer system and/or computer sub-components for carrying out the methods of the various embodiments and/or to create a computer-readable media that stores a software program to implement the method aspects of the various embodiments.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A method comprising:
    formulating, by a computer system, a logical model of an underground hydrocarbon formation based on data of an actual underground hydrocarbon formation, the model comprising a plurality of grid blocks;
    simulating reaction of the formation to hydrocarbon extraction over a plurality of time steps, the simulating by:
        determining a first approximation of a migration of fluid saturations across two or more of the plurality of grid blocks during at least one of the plurality of time steps;
        iteratively correcting the first approximation of the migration of fluid saturations within each of the two or more grid blocks to account for an effect of one or more physical flow properties not considered in the first approximation, until a predetermined minimum error value is reached; and
        displaying a visual depiction of a location of a boundary of fluid saturations within the logical model of the underground hydrocarbon formation, based on the corrected first approximation.

2. The method of claim 1, wherein correcting comprises correcting the first approximation to account for the effect of at least one of the physical flow properties selected from the group consisting of: gravity; relative permeability as water saturation changes within a grid block; capillary pressure; and transverse flux.

3. The method of claim 1, wherein correcting further comprises simultaneously solving a plurality of Buckley-Leverett equations for each of the two or more grid blocks, and each of the plurality of Buckley-Leverett equations takes into account the effect of the one or more physical flow properties not considered in the first approximation.

4. The method of claim 3, wherein simultaneously solving the plurality of Buckley-Leverett equations comprises simultaneously solving the plurality of Buckley-Leverett equations to correct for at least one of the physical flow properties selected from the group consisting of: gravity; relative permeability as water saturation changes with a grid block; capillary pressure; and transverse flux.

5. The method of claim 1, wherein simulating further comprises simulating reaction of the underground hydrocarbon formation to at least one hydrocarbon extraction point over the time step.

6. The method of claim 1, wherein correcting the first approximation further comprises:
calculating a change in fluid saturations for each of the two or more grid blocks during the time step based on a cell pore volume of each of the two more grid blocks relative to a size of the time step;
determining a total fluid flow velocity within each of the two or more grid blocks, based on the corresponding change in fluid saturations; and
correcting the first approximation of the migration of fluid saturations within each of the two or more grid blocks to account for the effect of the one or more physical flow properties, based at least in part on the total fluid flow velocity within each of the two or more grid blocks.

7. A non-transitory computer-readable storage medium storing a program that, when executed by one or more processors, causes the processor(s) to perform a plurality of functions, including functions to:
formulate a model of an underground hydrocarbon formation based on data of an actual underground hydrocarbon formation, the model including a plurality of grid blocks;
simulate reaction of the formation to hydrocarbon extraction over a plurality of time steps, the simulation including functions performed by the processor to:
determine a first approximation of a migration of fluid saturations across two or more of a plurality of grid blocks during at least one of the plurality of time steps;
iteratively correct the first approximation of the migration of fluid saturations within each of the two or more grid blocks to account for an effect of one or more physical flow properties not considered in the first approximation, until a predetermined minimum error value is reached; and
display a visual depiction of a location of a boundary of fluid saturations within the logical model of the underground hydrocarbon formation, based on the corrected first approximation.

8. The non-transitory computer-readable storage medium of claim 7 wherein the correction of the first approximation accounts for the effect of at least one of the physical flow properties selected from the group consisting of: gravity; relative permeability as saturations change within a grid block; capillary pressure; and transverse flux.

9. The non-transitory computer-readable storage medium of claim 7 wherein the functions performed by the processor further include functions to simultaneously solve a plurality of Buckley-Leverett equations for each of the two or more grid blocks, and each of the plurality of Buckley Leverett equations that is solved takes into account an effect of the one or more physical flow properties not considered in the first approximation.

10. The non-transitory computer-readable storage medium of claim 9 wherein the plurality of Buckley-Leverett equations are simultaneously solved to correct for the effect of at least one of the physical flow properties selected from the group consisting of: gravity; relative permeability as saturations change within a grid block; capillary pressure; and transverse flux.

11. The non-transitory computer-readable storage medium of claim 7 wherein the functions performed by the processor further include functions to model the reaction of the underground hydrocarbon formation to at least one hydrocarbon extraction point during the time step.

12. The non-transitory computer-readable storage medium of claim 7 wherein the functions performed by the processor further include functions to:
calculate a change in fluid saturations for each of the two or more grid blocks during the time step based on a cell pore volume of each of the two more grid blocks relative to a size of the time step;
determine a total fluid flow velocity within each of the two or more grid blocks, based on the corresponding change in fluid saturations; and
correct the first approximation of the migration of the fluid saturations within each of the two or more grid blocks to account for the effect of the one or more physical flow properties, based at least in part on the total fluid flow velocity within each of the two or more grid blocks.

13. A computer system comprising:
a processor; and
a memory coupled to the processor, the memory stores a program that, when executed by the processor, causes the processor to perform a plurality of functions, including functions to:
formulate a model of an underground hydrocarbon formation based on data of an actual underground hydrocarbon formation, the model including a plurality of grid blocks;
simulate reaction of a formation model to hydrocarbon extraction over a plurality of time steps, the simulation within each time step causes the processor to:
determine a first approximation of a migration of fluid saturations across two or more of a plurality of grid blocks during at least one of the plurality of time steps;
iteratively correct the first approximation of the migration of fluid saturations within each of the two or more grid blocks to account for an effect of one or more physical flow properties not considered in the first approximation, until a predetermined minimum error value is reached; and
display a visual depiction of a location of a boundary of fluid saturations within the logical model of the underground hydrocarbon formation, based on the corrected first approximation.

14. The computer system of claim 13 wherein the correction of the first approximation accounts for the effect of at least one of the physical flow properties selected from the group consisting of: gravity; relative permeability as saturations change within a grid block; capillary pressure; and transverse flux.

15. The computer system of claim 13 wherein the functions performed by the processor further include functions to simultaneously solve a plurality of Buckley-Leverett equations for each of the two or more grid blocks, and each of the plurality of Buckley Leverett equations that is solved takes into account an effect of the one or more physical flow properties not considered in the first approximation.

16. The computer system of claim 15 wherein the plurality of Buckley-Leverett equations are simultaneously solved to correct for the effect of at least one of the physical flow properties selected from the group consisting of: gravity; relative permeability as saturations change within a grid block; capillary pressure; and transverse flux.

17. The computer system of claim 13 wherein the functions performed by the processor further include functions to model the reaction of the underground hydrocarbon formation to at least one non-hydrocarbon injection point and at least one hydrocarbon extraction point during the time step.

18. The computer system of claim 13 wherein the functions performed by the processor further include functions to:
   calculate a change in fluid saturations for each of the two or more grid blocks during the time step based on a cell pore volume of each of the two more grid blocks relative to a size of the time step;
   determine a total fluid flow velocity within each of the two or more grid blocks, based on the corresponding change in fluid saturations; and
   correct the first approximation of the migration of the fluid saturations within each of the two or more grid blocks to account for the effect of the one or more physical flow properties, based at least in part on the total fluid flow velocity within each of the two or more grid blocks.

19. The method of claim 1, wherein the first approximation is iteratively corrected to account for multiple phases and multiple components of the fluid saturations within each of the two or more grid blocks.

* * * * *